(12) United States Patent
Kolics et al.

(10) Patent No.: US 8,736,055 B2
(45) Date of Patent: May 27, 2014

(54) METHODS AND LAYERS FOR METALLIZATION

(75) Inventors: Artur Kolics, Fremont, CA (US); Nalla Praveen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 161 days.

(21) Appl. No.: 13/409,547

(22) Filed: Mar. 1, 2012

(65) Prior Publication Data
US 2013/0228923 A1 Sep. 5, 2013

(51) Int. Cl.
*H01L 23/48* (2006.01)

(52) U.S. Cl.
USPC .......... 257/751; 257/741; 257/E21.328; 438/660

(58) Field of Classification Search
USPC .......... 257/99, 751, 741; 438/122, 653; 29/829; 174/261
See application file for complete search history.

(56) References Cited

U.S. PATENT DOCUMENTS

| | | | |
|---|---|---|---|
| 6,037,257 A | 3/2000 | Chiang et al. | |
| 6,387,805 B2 | 5/2002 | Ding et al. | |
| 6,607,982 B1 | 8/2003 | Powell et al. | |
| 6,911,067 B2 | 6/2005 | Kolics et al. | |
| 7,101,790 B2 | 9/2006 | Lee et al. | |
| 7,119,018 B2 | 10/2006 | Lane et al. | |
| 7,202,159 B2 | 4/2007 | Ganapathiraman et al. | |
| 7,651,943 B2 | 1/2010 | Yu et al. | |
| 7,843,063 B2 * | 11/2010 | Baker-O'Neal et al. | 257/751 |
| 8,349,725 B2 * | 1/2013 | Sato et al. | 438/627 |
| 8,492,897 B2 * | 7/2013 | Cabral et al. | 257/751 |
| 2002/0076925 A1 * | 6/2002 | Marieb et al. | 438/678 |
| 2006/0113685 A1 * | 6/2006 | Ueki et al. | 257/785 |
| 2009/0117731 A1 | 5/2009 | Yu et al. | |
| 2010/0323517 A1 * | 12/2010 | Baker-O'Neal et al. | 438/653 |

OTHER PUBLICATIONS

Koiwa, et al. "The Structure of Electroless Cobalt Alloy Films for Perpendicular Magnetic Recording Media." J. Electrochem. Soc.. 133.4 (1986): 685-689. Web. Jun. 4, 2010.

Matsuda, Hitoshi, and Osamu Takano. "Effect of Mn-Codeposition on Electroless Co Alloy Magnetic Recording Films." Electronics and Communications in Japan, Part 2. 72.11 (1989): 76-84. Print.

Biddle, Margaret M. "An Introduction to SAMs: Self-Assembled Monolayers in Organic Chemistry." (2001). Web. Mar. 1, 2013. <http://www.chem.wisc.edu/areas/organic/studsemin/biddle/biddle-abs.pdf>.

Khaderbad et al. "Metallated Porphyrin Self Assembled Monolayers as Cu Diffusion Barriers for the Nano-scale CMOS Technologies." Nanotechnology, 2008. 8TH IEEE Conference on. Arlington. Aug. 18-21, 2008. pp. 167-170. Web. Jan. 19, 2009.

Kim, H.W., and N.-E. Lee. "Conformal electroless filling of Cu into patterned amorphous carbon layer modified by oxygen plasma and aminosilane treatments." The Journal of Vacuum Science and Technology B. 28.4 (2010): 715-719. Print.

(Continued)

*Primary Examiner* — Roy Potter
(74) *Attorney, Agent, or Firm* — Beyer Law Group LLP

(57) ABSTRACT

One aspect of the present invention is a method of making an electronic device. According to one embodiment, the method comprises depositing a cap layer containing at least one dopant onto a gapfill metal and annealing so that the at least one dopant migrates to grain boundaries and/or interfaces of the gapfill metal. Another aspect of the present invention is an electronic device.

36 Claims, 9 Drawing Sheets

(56) References Cited

OTHER PUBLICATIONS

Wang et al. "Self-assembled monolayer of designed and synthesized triazinedithiolsilane molecule as interfacial adhesion enhancer for integrated circuit." Nanoscale Research Letters. 6.1 (2011): 483. Web. Mar. 7, 2012. <http://www.nanoscalereslett.com/content/6/1/483>.

Yeung Au, et al., "Selective Chemical Vapor Deposition of Manganese Self-Aligned Capping Layer for Cu Interconnections in Microelectronics," Journal of The Electrochemical Society, Apr. 26, 2010, 157 (6) D341-D345 (2010).

* cited by examiner

METHODS AND LAYERS FOR METALLIZATION

BACKGROUND

One or more embodiments of the present invention pertain to fabrication of electronic devices such as integrated circuits; more specifically, one or more embodiments of the present invention relate to using capping layers and methods of metallization for electronic devices.

Metallization technologies that use metal and dielectric damascene and/or dual damascene structures have become widely used in the manufacture of electronic devices. Numerous established processes exist and are in use for fabricating such devices. Although remedies, of varying effectiveness, exist for metallization problems such as electromigration in electronic devices, such remedies may not be transferable to advanced electronic devices. As further improvements are made in electronic device technologies, existing methods of manufacturing technology may become unsuitable for advanced electronic devices.

The present inventors have made one or more discoveries that may be pertinent to metallization for electronic devices. The one or more discoveries may have the potential to provide one or more methods and materials for improving the fabrication of present-day and advanced electronic devices.

SUMMARY

One or more aspects of the present invention pertain to fabrication of electronic devices. One aspect of the present invention is a method of making an electronic device. According to one embodiment, the method comprises depositing a cap layer containing at least one dopant onto a gapfill metal and annealing so that the at least one dopant migrates to grain boundaries and/or interfaces of the gapfill metal. According to another embodiment, the method comprises forming a metal gapfill; depositing a cap layer on the metal gapfill, the cap layer comprises at least one dopant; and annealing to cause the at least one dopant to migrate to interfaces and/or grain boundaries of the metal gapfill. Another aspect of the present invention is an electronic device.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting.

BRIEF DESCRIPTION OF THE DRAWINGS

FIG. 3-1 is a cross-section side view of a substrate for processing according to an embodiment of the present invention.

FIG. 3-2 is a cross-section side view of a substrate for processing according to an embodiment of the present invention.

FIG. 3-3 is a cross-section side view of a substrate for processing according to an embodiment of the present invention.

FIG. 3-4 is a cross-section side view of a substrate for processing according to an embodiment of the present invention.

FIG. 3-5 is a cross-section side view of an embodiment of the present invention.

FIG. 4 is a cross-section side view of an embodiment of the present invention.

FIG. 5 is a cross-section side view of an embodiment of the present invention.

Figure 1:
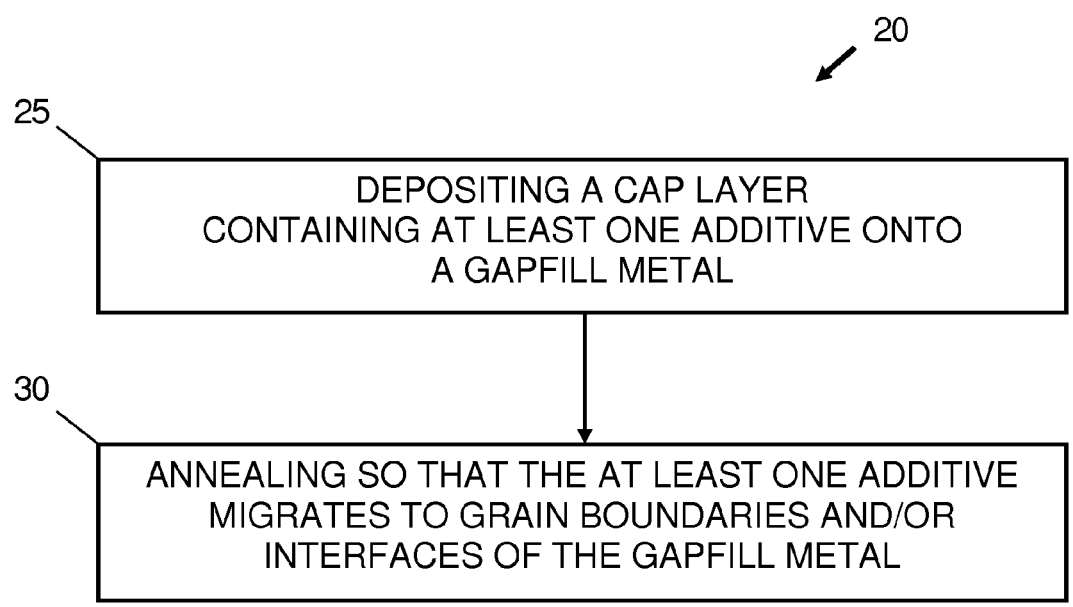
FIG. 1 is a process flow diagram according to an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding embodiments of the present invention.

DESCRIPTION

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc. A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

One or more embodiments of the present invention pertain to methods, and/or materials for metallization layers. More specifically, the present invention is directed toward methods and/or materials for metallization layers of electronic devices and toward electronic devices.

Embodiments of the present invention will be discussed below primarily in the context of processing semiconductor wafers such as silicon wafers used for fabricating electronic devices. The electronic devices include copper and/or another electrical conductor. However, it is to be understood that embodiments in accordance with the present invention may be used for other types of semiconductor devices, wafers other than semiconductor wafers, and electrical conductors other than copper. Examples of suitable metal layers for embodiments of the present invention include, but are not limited to, copper, cobalt, nickel, tungsten, nickel phosphorous, nickel platinum silicide, cobalt tungsten, cobalt tungsten phosphorus, and combinations thereof.

In the following description of the figures, identical reference numerals have been used when designating substantially identical elements or processes that are common to the figures.

Reference is now made to FIG. 1 where there is shown a process flow diagram 20 according to one or more embodiments of the present invention. Process flow diagram 20 shows a method of making an integrated circuit. FIG. 1 shows process flow diagram 20 comprising process 25 and process 30.

Process 25 comprises depositing a cap layer containing at least one dopant onto a gapfill metal. The cap layer may be an electrically conductive layer such as a metal or metal alloy or the cap layer may be a substantially non-electrically conductive layer such as an insulating layer. The dopant is an element or combination of elements present in the cap layer usually as a minor component. In other words, the dopant is present at a smaller concentration than at least one other component of the cap layer. According to one embodiment of the present invention, the dopant has one or more properties such as a low reactivity with the gapfill metal, a high diffusion rate through the gapfill metal, and/or a preference for residing at grain boundaries and/or interfaces of the gapfill metal after processes such as a thermal anneal. The dopant is selected to have properties so that the presence of the dopant at grain boundaries of the gapfill metal reduces the electromigration of gapfill metal ions/atoms and/or the presence of the dopant at interfaces of the gapfill metal provides a barrier to diffusion of the gapfill metal ions/atoms beyond the interface.

Process 30 comprises annealing so that the at least one dopant migrates to grain boundaries and/or interfaces of the gapfill metal. According to one or more embodiments of the present invention, the annealing comprises heating at least the cap layer and the gapfill metal to an effective temperature for an effective amount of time so that the dopant migrates to grain boundaries and/or interfaces of the gapfill metal. According to one or more embodiments of the present invention, the annealing may further include crystallization of the gapfill metal and/or crystal grain growth.

According to one or more embodiments of the present invention, the dopant migrates to grain boundaries and/or interfaces of the gapfill metal during a subsequent elevated temperature process. According to one embodiment of the present invention, the dopant migrates to the grain boundaries and/or interfaces of the gapfill metal during an anneal of a subsequent higher level metallization layer such as for crystallization of the metallization layer.

According to one or more embodiments of the present invention, the cap layer and the one or more dopants are deposited by a selective deposition process. According to one or more embodiments of the present invention, the cap layer and the one or more dopants are deposited by electroless deposition. Descriptions of electroless deposition processes suitable for one or more embodiments of the present invention can be found in commonly owned U.S. Pat. No. 6,794,288 to Kolics et al. and U.S. Pat. No. 6,911,076 to Kolics et al.; the contents of all of these patents are incorporated herein, in their entirety by this reference. Optionally, a non-selective deposition process can be used to deposit the cap layer.

According to one or more embodiments of the present invention, the cap layer is applied to the gapfill metal as a capping layer for the gapfill metal. The cap layer may be an electrically conductive layer such as a metal or metal alloy or the cap layer may be a substantially non-electrically conductive layer such as an insulating layer. More specifically, the cap layer is formed on the top exposed surface of the gapfill metal. Optionally, the cap layer is formed by a process such as electroless deposition.

According to one or more embodiments of the present invention, at least one dopant comprises manganese. According to another embodiment of the present invention, the cap layer comprises cobalt or nickel and the at least one dopant comprises manganese. Optionally, the cap layer is formed by a process such as electroless deposition.

According to one or more embodiments of the present invention, the cap layer comprises cobalt or nickel and the at least one dopant comprises one or more of arsenic, gallium, germanium, indium, iron, lead, mercury, tin, vanadium, zinc, or mixtures thereof. Optionally, the cap layer is formed by a process such as electroless deposition.

As an option for one or more embodiments of the present invention, the at least one dopant comprises one or more of arsenic, gallium, germanium, iron, lead, mercury, vanadium, or mixtures thereof. As an option for one or more other embodiments of the present invention, the at least one dopant comprises antimony, bismuth, cadmium, chromium, gold, indium, iridium, molybdenum, osmium, palladium, platinum, rhenium, rhodium, ruthenium, silver, technetium, thallium, tin, zinc, or mixtures thereof. According to still another embodiment of the present invention, the at least one dopant comprises one or more of boron, molybdenum, phosphorus, tungsten, or mixtures thereof. Optionally, the cap layer is formed by a process such as electroless deposition.

According to one or more embodiments of the present invention, the cap layer comprises gold, palladium, platinum, rhenium, ruthenium, silver, zinc, or mixtures thereof. As an option for such embodiments, the at least one dopant comprises manganese. As another option for such embodiments, the at least one dopant comprises arsenic, gallium, germanium, iron, lead, mercury, vanadium, or mixtures thereof. As still another option for such embodiments, the at least one dopant comprises antimony, bismuth, cadmium, chromium, indium, iridium, molybdenum, osmium, rhodium, technetium, thallium, tin, or mixtures thereof. Optionally, the cap layer is formed by a process such as electroless deposition.

For one or more embodiments of the present invention, the cap layer further comprises tungsten and/or boron. According to a more specific embodiment of the present invention, the cap layer comprises cobalt, tungsten, and boron. According to another embodiment of the present invention, the cap layer comprises cobalt, tungsten, and phosphorous. Optionally, the at least one dopant may be selected from any of the dopants described above or mixtures thereof.

For one or more embodiments of the present invention, the cap layer comprises cobalt, tungsten, and boron and a dopant that comprises manganese. According to one or more other embodiments of the present invention, the cap layer comprises cobalt, tungsten, and phosphorous and a dopant that comprises manganese. In still additional embodiments of the present invention, the cap layer comprises cobalt and tungsten and a dopant that comprises arsenic, gallium, germanium, iron, lead, mercury, vanadium, or mixtures thereof.

Embodiments of the present invention may include the use of a variety of types of interfaces for the gapfill metal. According to one or more embodiments of the present invention, the gapfill metal forms an interface with a barrier layer such as a tantalum and/or tantalum nitride barrier layer. As an option for one or more embodiments of the present invention, the gapfill metal forms an interface with a barrier layer such as silicon nitride, silicon carbonitride, silicon carbide, aluminum oxide, aluminum nitride, or other substantially dielectric barrier layer. According to one embodiment of the present invention, the interfaces of the gapfill metal comprise an organic layer. According to one embodiment of the present invention, the interfaces of the gapfill metal comprise a self-assembled monolayer. According to one embodiment of the present invention, the interfaces of the gapfill metal comprise an organic self-assembled monolayer. According to one embodiment of the present invention, the interfaces of the gapfill metal comprise an organic layer such as, but not limited to, an amorphous carbon layer, organic layers of organosilane compounds, organic layers of triazinedithiolsilane compounds, and organic compounds of metallated porphyrin compounds. According to one or more embodiments of the present invention, interfaces of the gapfill metal comprise self-assembled monolayers of organic compounds. Optionally, embodiments of the present invention may include using an interface between the gapfill metal and an adhesion layer.

Another embodiment of the present invention comprises an integrated circuit and/or intermediate device structures made by the method presented in process flow diagram 20 and described in further detail above.

Figure 2:
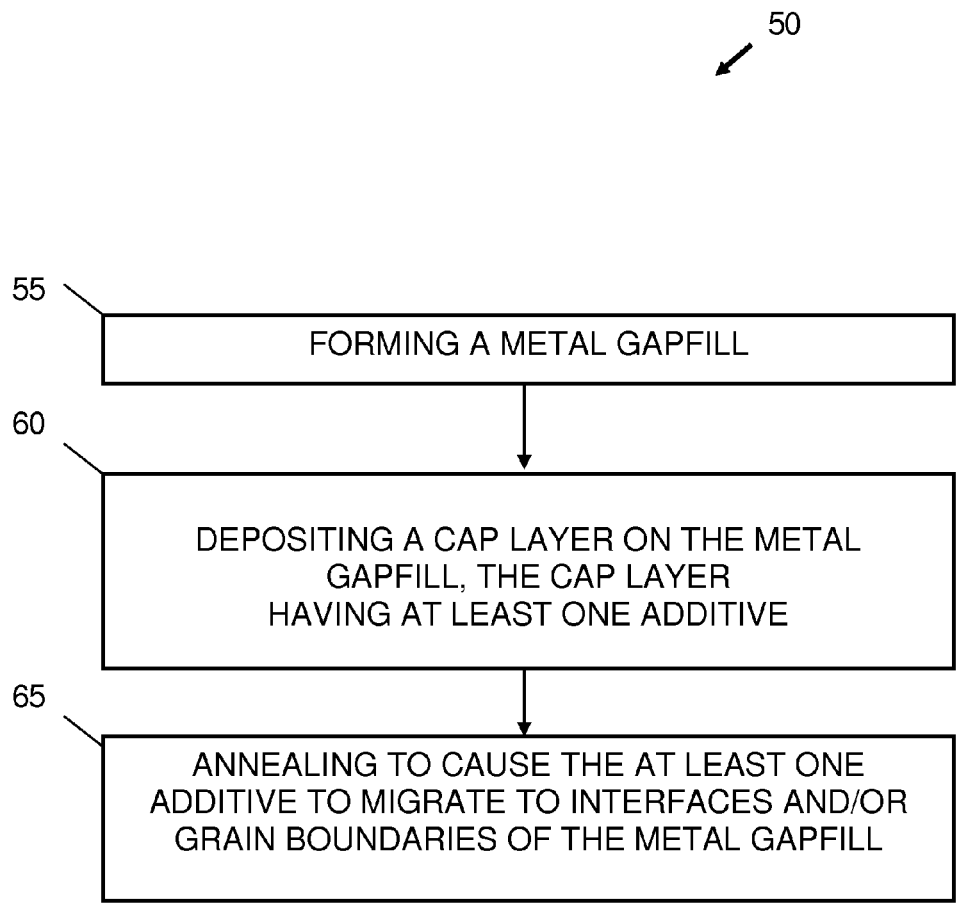
FIG. 2 is a process flow diagram according to an embodiment of the present invention.

Reference is now made to FIG. 2 where there is shown a process flow diagram 50 according to one or more embodiments of the present invention. Process flow diagram 50 shows a method of making an integrated circuit. FIG. 2 shows process flow diagram 50 comprising process 55, process 60, and process 65.

Process 55 comprises forming a metal gapfill such as for an integrated circuit. According to one or more embodiments of the present invention, the metal gapfill is formed in a substrate that has damascene and/or dual damascene structures for vias and trenches formed in a dielectric. The metal gapfill fills the vias and/or trenches to form metal lines and interconnects. According to one or more embodiments of the present invention, the metal gapfill is achieved using processes such as, but not limited to, chemical vapor deposition, electrochemical plating, and/or electroless deposition. Optionally, process 55 may include overfilling the damascene and/or dual damascene structures so that there is an overburdened of gapfill metal; the overburdened of gapfill metal is removed by processes such as, but not limited to, chemical etching, chemical mechanical planarization, electrochemical planarization, and polishing. According to one or more embodiments of the present invention, process 55 provides metal gapfill to fill features in a dielectric and the top surface of the metal gapfill is substantially planarized and exposed.

Optionally, process 55 may further include providing a barrier layer and/or a liner layer over the damascene and/or dual damascene structures prior to forming a metal gapfill. Examples of suitable materials for the barrier layer and/or the liner layer are known to persons of ordinary skill in the art. Process 50 may also include forming a seed layer for initiation of electroless deposition of the gapfill metal or for electrochemical plating of the gapfill metal.

According to one or more embodiments of the present invention, process 55 comprises forming a substantially pure seed layer so as to use the higher electrical conductivity of a substantially pure seed layer rather than the lower electrical conductivity of a seed layer that contains additional elements such as dopant elements and alloying elements. According to one or more embodiments of the present invention, process 55 comprises forming a metal gapfill that is a substantially pure metal. According to another embodiment of the present invention, process 55 is accomplished by forming a substantially pure seed layer and electrochemically plating the metal gapfill from the seed layer. Optionally, the seed layer may be copper and the gapfill metal may be copper and either one or both may be deposited using chemical vapor deposition, electroless deposition, and/or electrochemical plating.

Process 60 comprises depositing a cap layer on the metal gapfill exposed surface. The cap layer comprises at least one dopant. The cap layer caps the exposed surface of the gapfill metal. The cap layer performs one or more of the functions of a capping layer for gapfill metallization. The cap layer performs one or more additional functions that result from the presence of the at least one dopant that is also present in the cap layer.

According to one embodiment of the present invention, process 60 comprises depositing the cap layer on the metal gapfill exposed surface using a selective deposition process such as electroless deposition, a selective chemical vapor deposition process, a blanket chemical vapor deposition process, electrochemical plating, and/or physical deposition process such as sputtering or evaporation.

According to one embodiment of the present invention, process 55 includes using electroless deposition and/or electrochemical plating of copper to form the metal gapfill and process 60 includes using electroless deposition to deposit the cap layer on the metal gapfill. According to one or more embodiments of the present invention, the metal gapfill comprises copper.

Process 65 comprises annealing the substrate obtained from process 60 to cause the at least one dopant present in the cap layer to migrate to interfaces and/or grain boundaries of the metal gapfill. Optionally, the anneal can be performed as a dedicated step to accomplish the migration of the at least one dopant to the interfaces and/or grain boundaries of the gapfill metal. Alternatively, one or more embodiments of the present invention accomplish the anneal as part of a subsequent process step that includes exposure of the substrate to an elevated temperature for a sufficient length of time which is also performed for another purpose other than migration of the least one dopant. In other words, the migration of the least one dopant may be accomplished using a subsequent anneal used for purposes, such as but not limited to, recrystallization of metal gapfill for an existing or subsequent metallization layer.

According to one or more embodiments of the present invention illustrated in FIG. 2, a cap layer is formed on metal gapfill of a damascene or dual damascene metallization of an integrated circuit. The cap layer also comprises at least one dopant. The dopant is selected because it has one or more properties so as to be capable of migrating to and accumulating at grain boundaries and/or interfaces of the metal gapfill. The migration of the at least one dopant is accomplished by a thermal anneal at a sufficiently elevated temperature and for a sufficient length of time. According to one embodiment of the present invention, the dopant comprises manganese. According to another embodiment of the present invention, the dopant comprises arsenic, gallium, germanium, iron, lead, mercury, vanadium, or mixtures thereof. According to another embodiment of the present invention, the dopant comprises antimony, bismuth, cadmium, chromium, gold, indium, iridium, molybdenum, osmium, palladium, platinum, rhenium, rhodium, ruthenium, silver, technetium, thallium, tin, zinc, or mixtures thereof.

One or more additional embodiments of the present invention comprise a method of making an electronic device such as an integrated circuit. The method comprises providing a substrate having vias and/or trenches formed in a dielectric for damascene or dual damascene metallization. The method may also comprise depositing a barrier layer on the dielectric so as to cover the dielectric of the substrate including the surfaces of the vias and trenches. Optionally, the barrier layer may comprise tantalum and/or tantalum nitride. The method may also comprise depositing a substantially pure copper seed layer over the barrier layer. The method further comprises growing gapfill copper on the copper seed layer so as to substantially fill the vias and/or trenches. The method may also include a planarization of the gapfill copper to remove overburden copper and form the metallization lines and/or contacts. The method further comprises electrolessly depositing a cap layer comprising cobalt and/or nickel, and further comprising manganese onto the gapfill copper. The method also comprises annealing so that the manganese migrates to grain boundaries and/or interfaces of the copper. Optionally, the cap layer further comprises boron, phosphorous, and/or tungsten. As another option, the cap layer comprises cobalt, tungsten, and boron. For still another option, the cap layer comprises cobalt, tungsten, and phosphorous.

Reference is now made to FIG. 3-1, FIG. 3-2, FIG. 3-3, FIG. 3-4, and FIG. 3-5 where there are shown cross-section side views of a portion of a substrate being processed according to one or more embodiments of methods of the present invention. More specifically, FIG. 3-1, FIG. 3-2, FIG. 3-3, FIG. 3-4, and FIG. 3-5 show one or more results of sequential processing of the substrate according to one or more embodiments of the present invention.

Figures 1, 3:
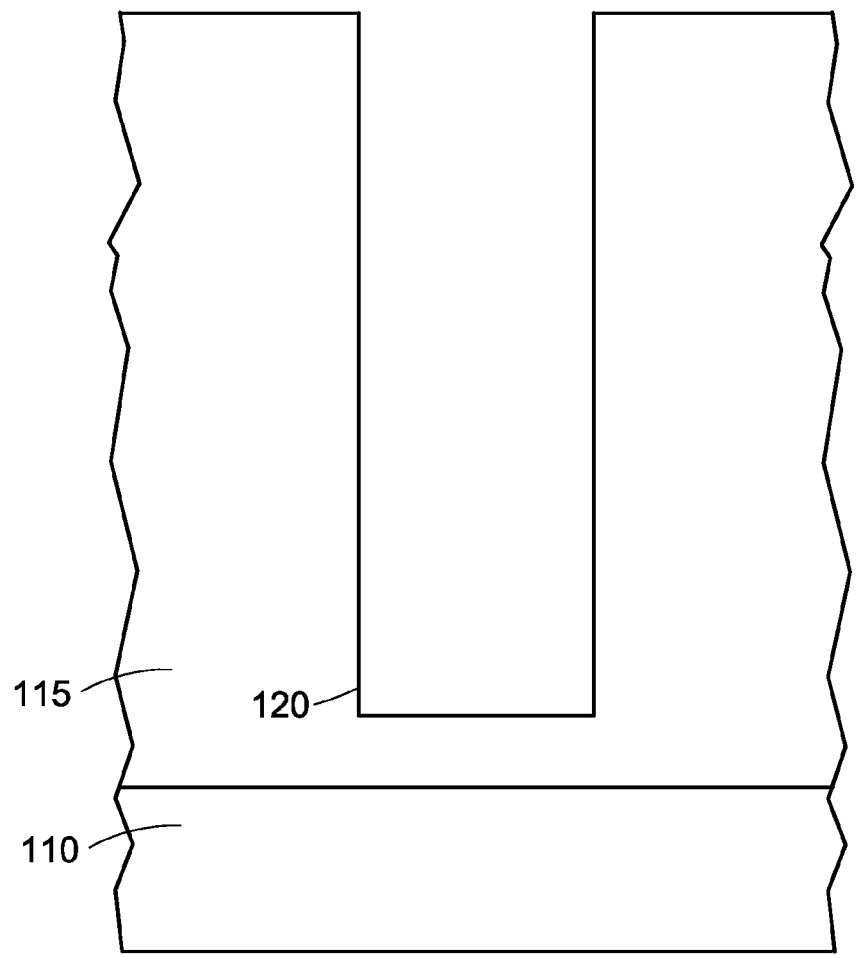
Figures 2, 3:
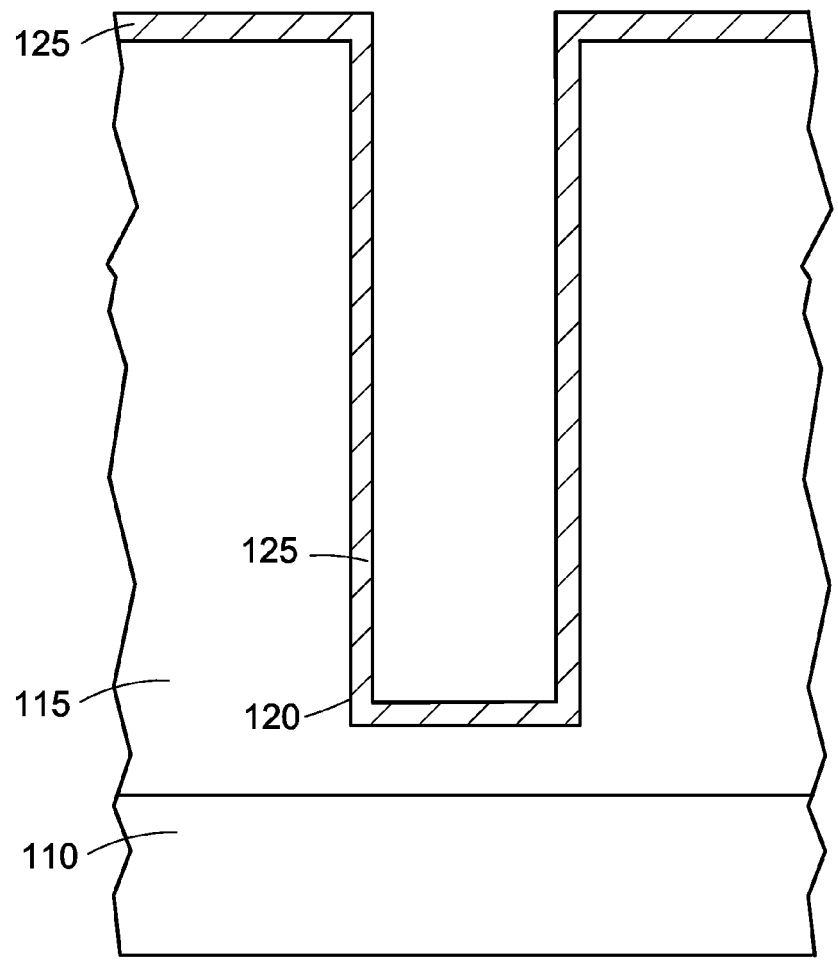
Figure 3:
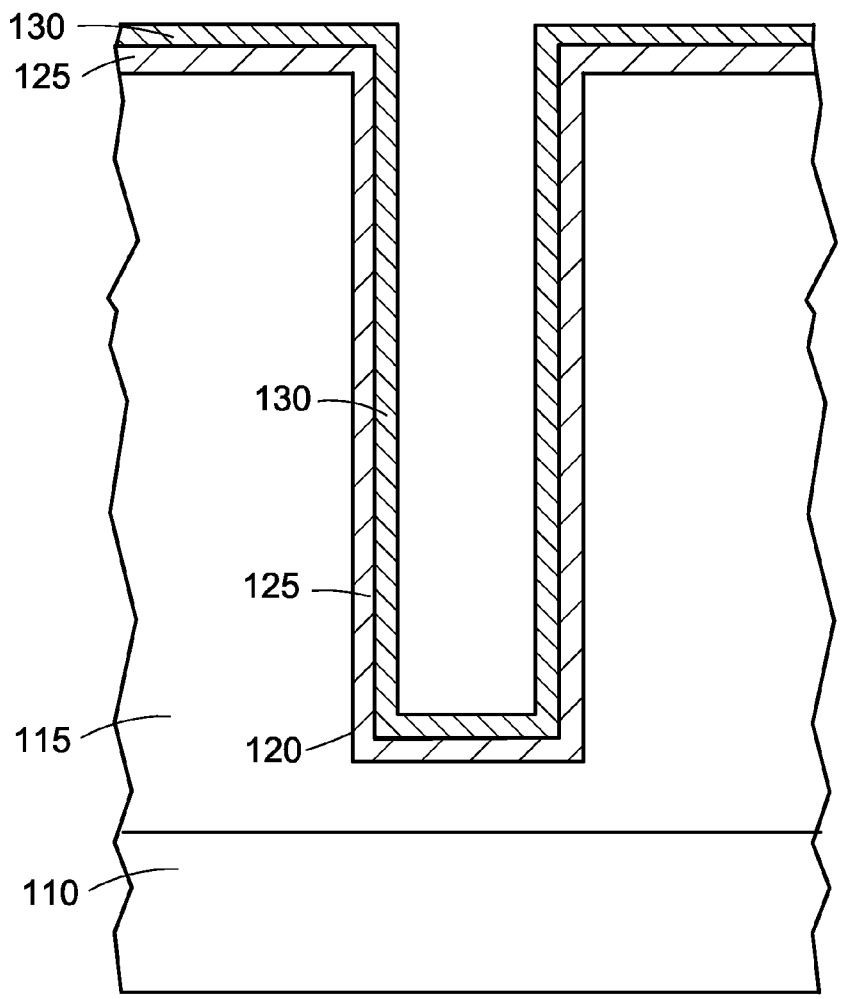

FIG. 3-1 shows a substrate 101 having a base 110 and a dielectric layer 115 on base 110. Optionally, base 110 may comprise a semiconductor wafer, a semiconductor layer, and/or a lower metallization layer. Dielectric layer 115 may be a dielectric material such as, but not limited to, silicon dioxide, silicon oxide, a low-k dielectric of carbon-doped silica, other dielectric used for integrated circuits. Dielectric layer 115 has a via or trench 120 formed therein such as a via or trench for a damascene or dual damascene metallization structure.

FIG. 3-2 shows a substrate 102 that results from depositing a substantially conformal barrier or liner layer 125 over dielectric 115 including the via or trench 120. Barrier or liner layer 125 comprises materials typically used for barrier and liner applications such as, but not limited to, aluminum nitride, aluminum oxide, silicon carbide, silicon carbonitride, silicon nitride, tantalum, tantalum nitride, tantalum/tantalum nitride, titanium, and/or titanium nitride. According to one or more embodiments of the present invention, barrier or liner layer 125 comprises an organic layer such as, but not limited to, an amorphous carbon layer, organic layers of organosilane compounds, organic layers of triazinedithiolsilane compounds, and organic compounds of metallated porphyrin compounds. According to one or more embodiments of the present invention, barrier or liner layer 125 comprises self-assembled monolayers of the organic compounds. As an option for one or more embodiments of the present invention, the integrated circuit may not include a barrier or liner layer 125.

FIG. 3-3 shows a substrate 103 that results from depositing a substantially conformal seed layer 130 over barrier or liner layer 125. The inclusion of seed layer 130 is optional for one or more embodiments of the present invention. When included, seed layer 130 may be used for growing a gapfill metal by processes such as electrochemical plating and such as electroless deposition. Seed layer 130 may comprise a variety of metals such as, but not limited to, copper, ruthenium, cobalt, and/or metal alloys.

Figures 3, 4:
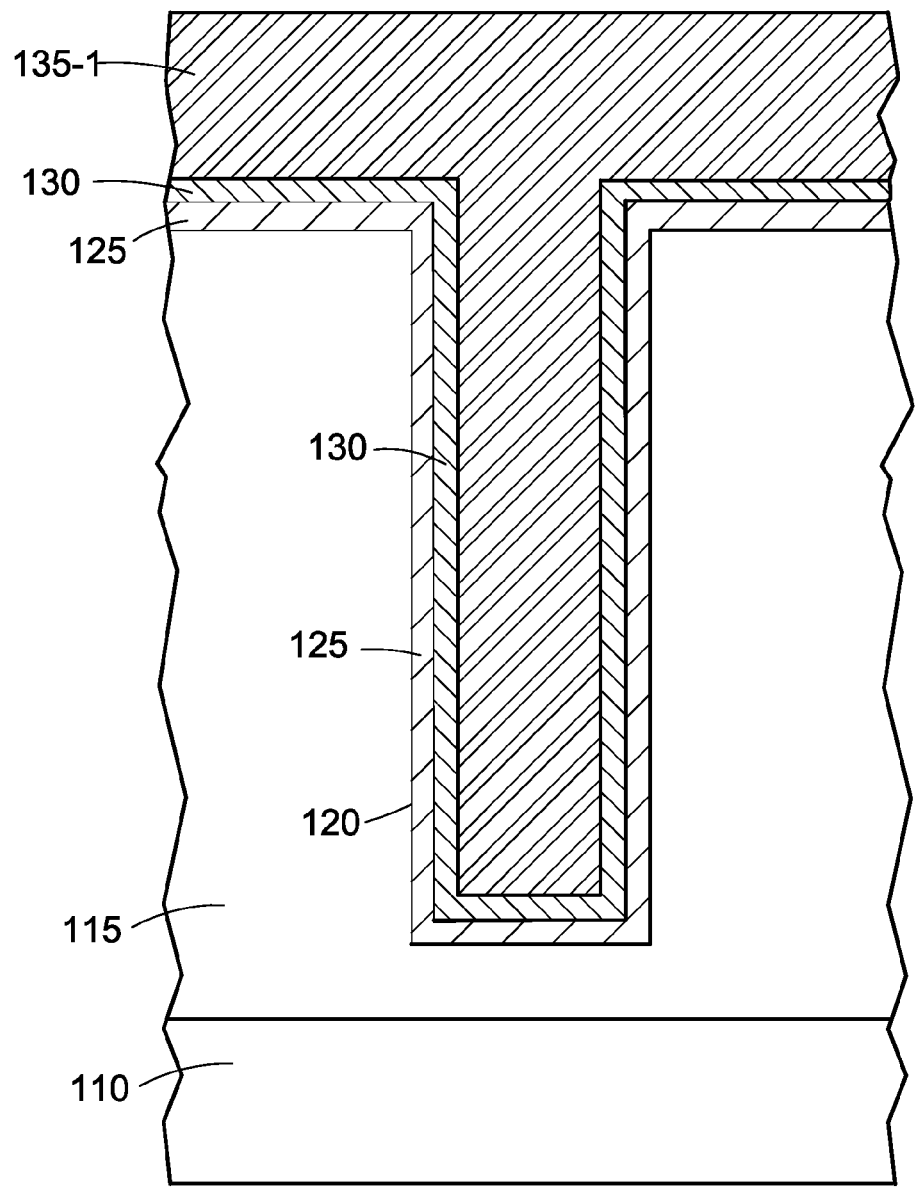

FIG. 3-4 shows a substrate 104 that results from growing a gapfill metal 135 that fills the vias or trenches 120 and optionally forms an overburden metal 135-1. Overburden metal 135-1 includes the portion of the gapfill metal that is deposited outside of the vias, the trenches, and the other features that are being filled. A variety of metals may be used for gapfill metal 135. According to one embodiment of the present invention gapfill metal 135 comprises copper. Optionally, gapfill metal 135 may comprise metals and/or metal alloys such as, but not limited to, cobalt, cobalt alloys, copper, copper alloys, other metals, other metal alloys suitable for integrated circuit metallization.

Figures 3, 4, 5:
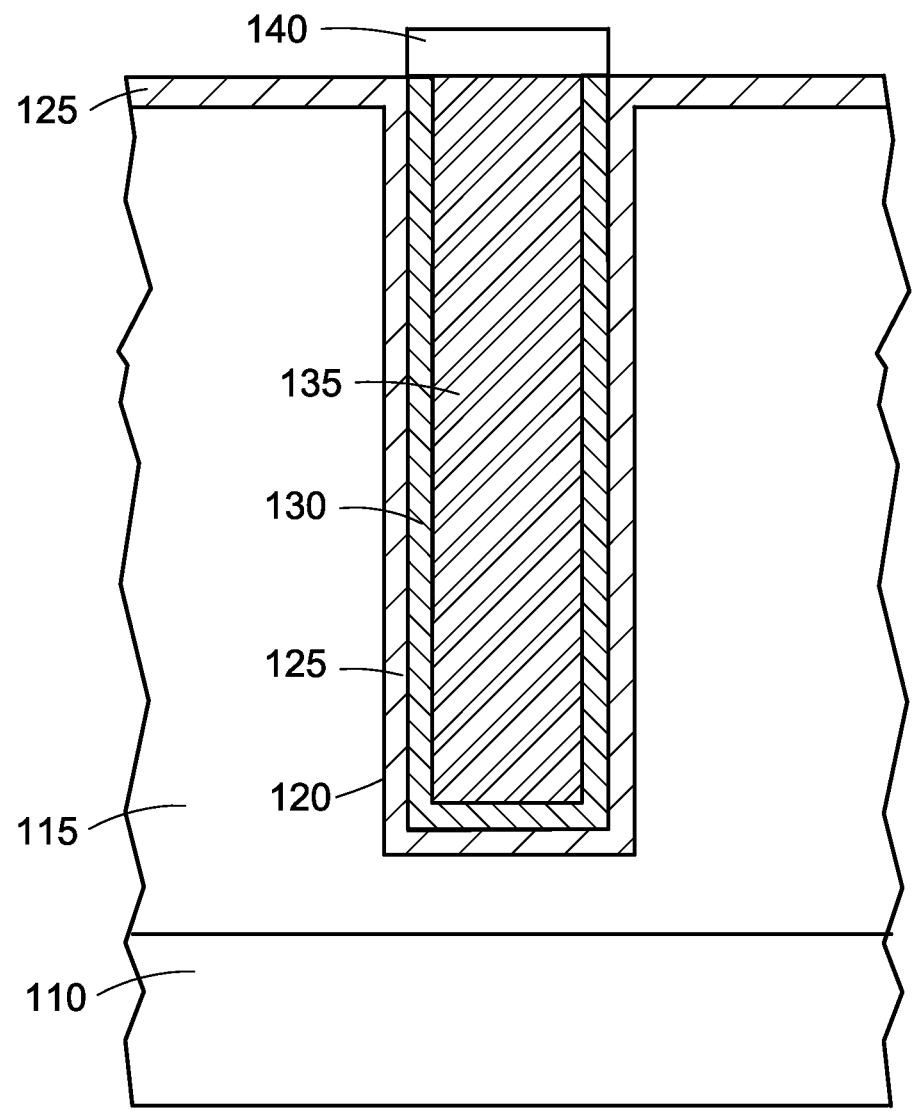
Figure 4:
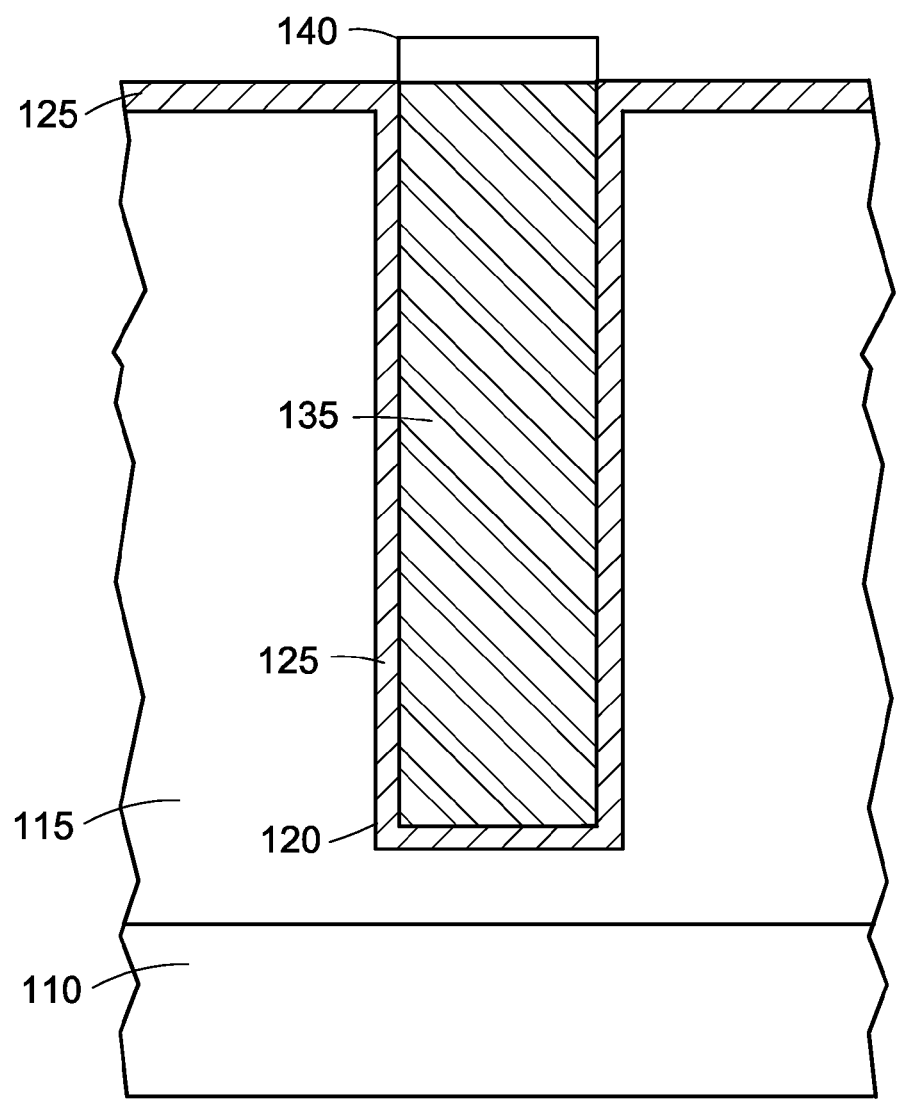
Figure 5:
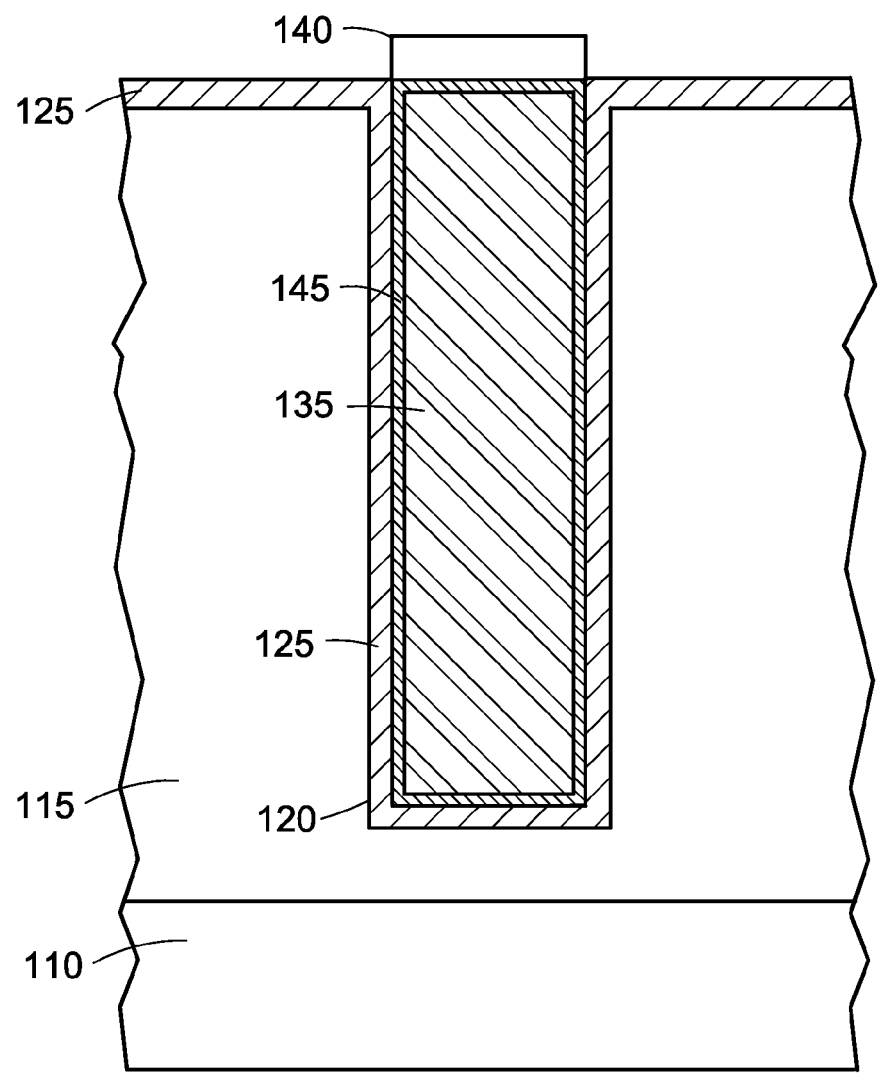

FIG. 3-5 shows a substrate 105 that results after removal of the overburden metal so as to planarize the gapfill metal and complete formation of trenches and via contacts so as to form a portion of an electronic device according to one or more embodiments of the present invention. Planarization of the gapfill metal can be achieved by processes such as chemical processes, electrochemical processes, physical processes, and/or chemical mechanical planarization processes.

Substrate 105 further includes a cap layer 140 formed over the planarized gapfill metal 135. Cap layer 140 may be an electrically conductive layer such as a metal or metal alloy or cap layer 140 may be a substantially non-electrically conductive layer such as an insulating layer. Cap layer 140 comprises at least one dopant. The at least one dopant is an element or combination of elements present in the cap layer usually as a minor component. In other words, the dopant is present at a smaller concentration than at least one other component of the cap layer.

According to one or more embodiments of the present invention, the dopant has one or more properties such as a low reactivity with the gapfill metal, a high diffusion rate through the gapfill metal, and/or a preference for residing at grain boundaries and/or interfaces of the gapfill metal after processes such as a thermal anneal. The dopant is selected to have properties so that the presence of the dopant at grain boundaries of the gapfill metal reduces the electromigration of gapfill metal ions/atoms and/or the presence of the dopant at interfaces of the gapfill metal provides a barrier to diffusion of the gapfill metal ions/atoms beyond the interface.

According to one or more embodiments of the present invention, the integrated circuit has the at least one or more dopants from cap layer 140 accumulated at grain boundaries and/or interfaces of the gapfill metal. According to one or more embodiments of the present invention, an elevated temperature anneal comprising heating at least cap layer 140 and gapfill metal 135 to an effective temperature for an effective amount of time so that at least a portion of the one or more dopants initially present in cap layer 140 migrates to grain boundaries and/or interfaces of gapfill metal 135.

According to one or more embodiments of the present invention, the at least one dopant comprises manganese. According to another embodiment of the present invention, the cap layer comprises cobalt or nickel and the at least one dopant comprises manganese. Optionally, cap layer 140 is formed by a process such as electroless deposition.

According to one or more embodiments of the present invention, cap layer 140 comprises cobalt or nickel and the at least one dopant comprises one or more of arsenic, gallium, germanium, iron, lead, mercury, vanadium, or mixtures thereof. Optionally, cap layer 140 is formed by a process such as electroless deposition.

As an option for one or more embodiments of the present invention, the at least one dopant comprises one or more of arsenic, gallium, germanium, iron, lead, mercury, vanadium, or mixtures thereof. As an option for one or more other embodiments of the present invention, the at least one dopant comprises antimony, bismuth, cadmium, chromium, gold, indium, iridium, molybdenum, osmium, palladium, platinum, rhenium, rhodium, ruthenium, silver, technetium, thallium, tin, zinc, or mixtures thereof. According to still another embodiment of the present invention, the at least one dopant comprises one or more of boron, molybdenum, phosphorus, tungsten, or mixtures thereof. Optionally, cap layer 140 is formed by a process such as electroless deposition.

According to one or more embodiments of the present invention, the cap layer comprises gold, palladium, platinum, rhenium, ruthenium, silver, zinc, or mixtures thereof. As an option for such embodiments, the at least one dopant comprises manganese. As another option for such embodiments, the at least one dopant comprises arsenic, gallium, germanium, iron, lead, mercury, vanadium, or mixtures thereof. As still another option for such embodiments, the at least one dopant comprises antimony, bismuth, cadmium, chromium, indium, iridium, molybdenum, osmium, rhodium, technetium, thallium, tin, or mixtures thereof. Optionally, cap layer 140 is formed by a process such as electroless deposition.

For one or more embodiments of the present invention, cap layer 140 further comprises tungsten and/or boron. According to a more specific embodiment of the present invention, cap layer 140 comprises cobalt, tungsten, and boron. According to another embodiment of the present invention, cap layer 140 comprises cobalt, tungsten, and phosphorous. Optionally, the at least one dopant may be selected from any of the dopants described above or mixtures thereof.

For one or more embodiments of the present invention, cap layer 140 comprises cobalt, tungsten, and boron and a dopant that comprises manganese. According to one or more other embodiments of the present invention, cap layer 140 comprises cobalt, tungsten, and phosphorous and a dopant that comprises manganese. In still additional embodiments of the present invention, cap layer 140 comprises cobalt and tungsten and a dopant that comprises arsenic, gallium, germanium, iron, lead, mercury, vanadium, or mixtures thereof.

Embodiments of the present invention may include the use of a variety of types of interfaces for a gapfill metal. According to one or more embodiments of the present invention, a gapfill metal forms an interface with a barrier layer wherein the barrier layer comprises tantalum and/or tantalum nitride or titanium and/or titanium nitride. As an option for one or more embodiments of the present invention, the gapfill metal forms an interface with a barrier layer wherein the barrier layer comprises a material such as, but not limited to, silicon nitride, silicon carbonitride, silicon carbide, aluminum oxide, aluminum nitride, or other substantially dielectric barrier layer. According to one or more embodiments of the present invention, the barrier layer comprises an organic layer such as, but not limited to, an amorphous carbon layer, organic layers of organosilane compounds, organic layers of triazinedithiolsilane compounds, and organic compounds of metallated porphyrin compounds. According to one or more embodiments of the present invention, the barrier layers are formed by self-assembled monolayers of organic compounds. Optionally, embodiments of the present invention may include using an interface between the gapfill metal and an adhesion layer.

Reference is now made to FIG. 4 where there is shown a cross-section side views of a substrate 150 illustrating a portion of an electronic device according to one or more embodiments of the present invention. Substrate 150 is essentially the same as substrate 105 presented in FIG. 3-5 with the exception that substrate 150 is fabricated without using a seed layer. More specifically substrate 105 includes a seed layer 130 whereas substrate 150 does not have a seed layer.

Substrate 150 includes base 110, a dielectric layer 115, trench or via 120, liner layer 125, gapfill 135, and cap layer 140 that are essentially the same as described for FIG. 3-1, FIG. 3-2, FIG. 3-3, FIG. 3-4, and FIG. 3-5.

Reference is also made to FIG. 5 which also shows a cross-section side view of substrate 150 as described above for FIG. 4. For the purpose of conceptual illustration, FIG. 5 also shows an enriched interface 145 to represent accumulation of the dopant at the interface between gapfill metal 135 and liner 125 as described above but not shown in FIG. 3-5 and FIG. 4.

In the foregoing specification, the invention has been described with reference to specific embodiments. However, one of ordinary skill in the art appreciates that various modifications and changes can be made without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A method of making an integrated circuit, the method comprising:
   depositing a cap layer containing at least one dopant onto a gapfill metal; and
   annealing so that the at least one dopant migrates to grain boundaries and/or interfaces of the gapfill metal, the interfaces comprising:
   tantalum and/or tantalum nitride,
   titanium and/or titanium nitride,
   an organic layer,
   a self-assembled monolayer,
   an organic self-assembled monolayer, or
   an amorphous carbon layer.

2. The method of claim 1, wherein the at least one dopant comprises manganese.

3. The method of claim 1, wherein the cap layer comprises cobalt or nickel and the at least one dopant comprises manganese.

4. The method of claim 1, wherein the cap layer comprises cobalt or nickel and the at least one dopant comprises arsenic, gallium, germanium, iron, lead, mercury, vanadium, or mixtures thereof.

5. The method of claim 1, wherein the at least one dopant comprises arsenic, gallium, germanium, iron, lead, mercury, vanadium, or mixtures thereof.

6. The method of claim 1, wherein the at least one dopant comprises antimony, bismuth, cadmium, chromium, gold, indium, iridium, molybdenum, osmium, palladium, platinum, rhenium, rhodium, ruthenium, silver, technetium, thallium, tin, zinc, or mixtures thereof.

7. The method of claim 1, wherein the at least one dopant comprises boron, molybdenum, phosphorus, tungsten, or mixtures thereof.

8. The method of claim 1, wherein the cap layer comprises gold, palladium, platinum, rhenium, ruthenium, silver, zinc, or mixtures thereof and the at least one dopant comprises manganese.

9. The method of claim 1, wherein the cap layer comprises gold, palladium, platinum, rhenium, ruthenium, silver, zinc, or mixtures thereof and the at least one dopant comprises arsenic, gallium, germanium, iron, lead, mercury, vanadium, or mixtures thereof.

10. The method of claim 1, wherein the cap layer comprises gold, palladium, platinum, rhenium, ruthenium, silver, zinc, or mixtures thereof and the at least one dopant comprises antimony, bismuth, cadmium, chromium, indium, iridium, molybdenum, osmium, rhodium, technetium, thallium, tin, or mixtures thereof.

11. The method of claim 1, wherein the interfaces comprise:

tantalum and/or tantalum nitride; or
titanium and/or titanium nitride.

12. The method of claim 1, wherein the cap layer further comprises tungsten and/or boron.

13. The method of claim 1, wherein the cap layer comprises cobalt, tungsten, and boron.

14. The method of claim 1, wherein the cap layer comprises cobalt, tungsten, and phosphorous.

15. An integrated circuit made by the method of claim 1.

16. A method of making an integrated circuit comprising:
   forming a metal gapfill;
   depositing a cap layer on the metal gapfill, the cap layer having at least one dopant;
   annealing to cause the at least one dopant to migrate to interfaces and/or grain boundaries of the metal gapfill, the interfaces comprising:
      tantalum and/or tantalum nitride,
      titanium and/or titanium nitride,
      an organic layer,
      a self-assembled monolayer,
      an organic self-assembled monolayer, or
      an amorphous carbon layer.

17. The method of claim 16, wherein depositing a cap layer on the metal gapfill is accomplished using electroless deposition.

18. The method of claim 16, wherein forming a metal gapfill is accomplished using electroless deposition and/or electrochemical plating.

19. The method of claim 16, wherein depositing a cap layer is accomplished using chemical vapor deposition.

20. The method of claim 16, wherein forming a metal gapfill is accomplished using electroless deposition and/or electrochemical plating of copper.

21. The method of claim 16, wherein depositing a cap layer is accomplished using selective deposition.

22. The method of claim 16, wherein forming a metal gapfill is accomplished by forming a substantially pure metal gapfill.

23. The method of claim 16, wherein forming a metal gapfill is accomplished by forming a substantially pure seed layer and electrochemically plating the metal gapfill on the seed layer.

24. A method of making an integrated circuit, the method comprising:
   providing a substrate having vias and/or trenches formed in a dielectric for damascene or dual damascene metallization;
   depositing a barrier layer on the dielectric, the barrier layer comprising:
      tantalum and/or tantalum nitride,
      an organic layer,
      a self-assembled monolayer, or
      an organic self-assembled monolayer;
   depositing a substantially pure copper seed layer; growing gapfill copper on the copper seed layer so as to substantially fill the vias and/or trenches;
   electrolessly depositing a cap layer comprising cobalt and/or nickel, and further comprising manganese onto the gapfill copper; and
   annealing so that the manganese migrates to grain boundaries and/or interfaces of the copper.

25. The method of claim 24, wherein the barrier layer comprises tantalum and/or tantalum nitride.

26. The method of claim 24, wherein the cap layer further comprises boron, phosphorous, and/or tungsten.

27. The method of claim 24, wherein the cap layer comprises cobalt, tungsten, and boron.

28. The method of claim 24, wherein the cap layer comprises cobalt, tungsten, and phosphorous.

29. An integrated circuit made by the method of claim 24.

30. The method of claim 1, wherein the interfaces of the gapfill metal comprise an organic layer.

31. The method of claim 1, wherein the interfaces of the gapfill metal comprise a self-assembled monolayer.

32. The method of claim 1, wherein the interfaces of the gapfill metal comprise an organic self-assembled monolayer.

33. The method of claim 24, wherein the barrier layer is an organic layer.

34. The method of claim 24, wherein the barrier layer comprises a self-assembled monolayer.

35. The method of claim 24, wherein the barrier layer is an organic self-assembled monolayer.

36. The method of claim 1, wherein the interfaces of the gapfill metal comprise an amorphous carbon layer.

* * * * *